US008847610B2

(12) United States Patent
Rimminen

(10) Patent No.: US 8,847,610 B2
(45) Date of Patent: Sep. 30, 2014

(54) METHOD AND SYSTEM FOR TRANSFERRING INFORMATION

(75) Inventor: Henry Rimminen, Helsinki (FI)

(73) Assignee: Elsi Technologies Oy, Vantaa (FI)

( * ) Notice: Subject to any disclaimer, the term of this patent is extended or adjusted under 35 U.S.C. 154(b) by 536 days.

(21) Appl. No.: 12/919,922

(22) PCT Filed: Feb. 25, 2009

(86) PCT No.: PCT/FI2009/050158
§ 371 (c)(1),
(2), (4) Date: Aug. 27, 2010

(87) PCT Pub. No.: WO2009/106686
PCT Pub. Date: Sep. 3, 2009

(65) Prior Publication Data
US 2011/0001489 A1   Jan. 6, 2011

(30) Foreign Application Priority Data

Feb. 28, 2008   (FI) ..................................... 20080165

(51) Int. Cl.
G08B 21/22       (2006.01)
G08B 13/24       (2006.01)
G01R 29/08       (2006.01)
G01V 3/12        (2006.01)

(52) U.S. Cl.
CPC ............ *G08B 13/2402* (2013.01); *G01R 29/08* (2013.01); *G01V 3/12* (2013.01); *G08B 21/22* (2013.01)
USPC ........................................................... 324/649

(58) Field of Classification Search
USPC ......................................................... 324/649
See application file for complete search history.

(56) References Cited

U.S. PATENT DOCUMENTS

| | | | |
|---|---|---|---|
| 6,335,684 B1 * | 1/2002 | Eisenmann et al. | 340/562 |
| 7,315,793 B2 * | 1/2008 | Jean | 702/150 |
| 2002/0185999 A1 * | 12/2002 | Tajima et al. | 324/76.75 |
| 2006/0097847 A1 | 5/2006 | Bervoets et al. | |

FOREIGN PATENT DOCUMENTS

| | | |
|---|---|---|
| JP | 2005-278791 A | 10/2005 |
| WO | WO 2007/099340 A1 | 9/2007 |
| WO | WO 2007/139574 A1 | 12/2007 |

* cited by examiner

*Primary Examiner* — Jeff Natalini
(74) *Attorney, Agent, or Firm* — Birch, Stewart, Kolasch & Birch, LLP

(57) ABSTRACT

The invention relates to a system for transferring information closely connected to an object. The system is characterized in that it comprises a conductor arrangement, which comprises a number of conductor components, that forms an electromagnetic field, as well as a transmitter associated with the object. The aforementioned transmitter is arranged to connect by means of an electromagnetic field to the conductor arrangement and also to modulate the measuring signal formed by means of the field.

14 Claims, 3 Drawing Sheets

METHOD AND SYSTEM FOR TRANSFERRING INFORMATION

FIELD OF THE INVENTION

Figure 1:
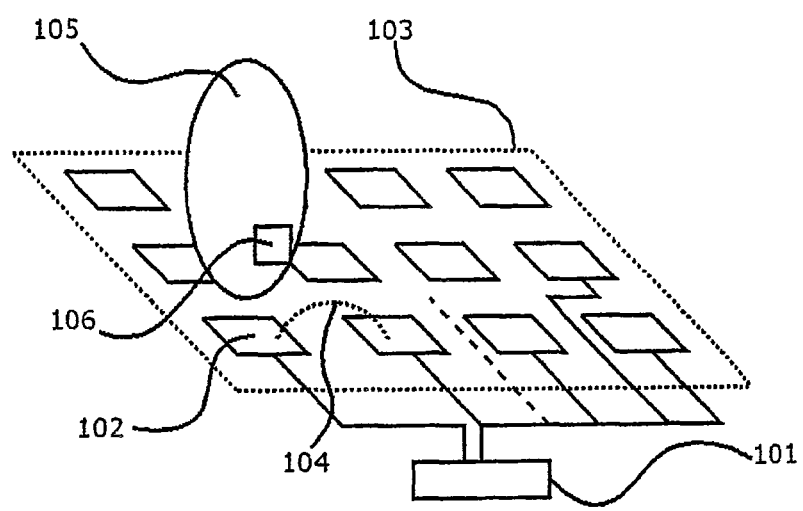

The object of this invention is a method and a system, based on near-field measurement, for transferring information.

STATE OF THE ART

In prior-art indoor position location systems, which are based on a radio frequency, ultrasound frequency or infrared frequency measurement of delay or power, it is possible to locate and identify an object by means of a portable transponder or corresponding. Systems that operate by means of a transponder are in this context called active position location systems. Of these, only systems that operate at infrared frequencies also work without a transponder, i.e. as passive systems. In this case identification does not succeed and position location measurement is only at the movement detection level. In this case the changes in IR power between rough sectors are measured. Indoor position location systems that operate without a transponder are called in this context passive position location systems. These types of systems comprise electret films, force sensor matrixes or pressure sensor matrixes, and position location measurement based on an electromagnetic near field. The advantage of film sensors, pressure sensors or near field sensors compared to active indoor position location systems is e.g. they do not need a portable transponder, or corresponding, for the position location function in order to operate. In addition, their range of coverage is not limited by reflections or shadow areas.

Active position location systems thus always require a portable transmitter in order to operate. In addition, the range of coverage of active systems is limited in indoor spaces by reflections and shadow areas. The aforementioned passive indoor position location methods do not require a transponder, nor do coverage problems occur in them. A problem with state-of-the-art passive systems is, however, that they do not enable identification of the object.

Some state-of-the-art systems are described in more detail e.g. in the following publications:

Hyunggi Cho, Myungseok Kang, Jonghyuk Park, Byungsung Park and Hagbae Kim. *Performance Analysis of Location Estimation Algorithm in ZigBee Networks using Received Signal Strength*. 21st International Conference on Advanced Information Networking and Applications Workshops (AINAW'07) 2007.

Ward, A., Jones, A. and Hopper, A. *A New Location Technique for the Active Office*. IEEE Personal Communications, Vol. 4, No. 5, October 1997. pp. 42-47.

Want, R., Hopper, A., Faleao, V. and Gibbons, J. *The Active Badge Location System*. Transactions on Information Systems, Vol. 10, No. 5, January 1992, pp. 42-47.

Kirjavainen, K. *Electromechanical Film and Procedure for Manufacturing Same*. U.S. Pat. No. 4,654,546, 1987.

Lekkala, Jukka and Paajanen, Mika. EMFi—*New Electret Material for Sensors and Actuators*. 10th International Symposium on Electrets, 1999.

Addlesee, Michael D., Jones, Alan., and Ivesey, Finnbarl. *The ORL Active Floor*. IEEE Personal Communications, Vol. 4, No. 5, October 1997, October 1997. pp. 35-41.

Murakita, Takuya, Ikeda, Tetsushi, and Ishiguro, Hiroshi. *Human Tracking using Floor Sensors based on the Markov Chain Monte Carlo Method*. Proceedings of the 17th International Conference on Pattern Recognition, 2004.

Sepponen, Raimo. *Method and Arrangement for Observation*. International Patent Application No. WO2004F100489 20040820, 2005. U.S. Patent Application No. 2007008145, 2007.

Rimminen, Henry, Linnavuo, Matti, and Sepponen, Raimo. *Human Tracking Using Near Field Imaging*. Proceedings of Pervasive Health 2008, Tampere, Finland.

BRIEF DESCRIPTION OF THE INVENTION

The invention presents an indoor position location system based on the measurement of an electromagnetic near field and a method that identifies its object, in addition to locating the position, and transfers information relating to the identified object between the object of the position location and the position location system.

The system according to the invention for transferring information closely connected to an object in an electromagnetic field is characterized in that the system comprises a conductor arrangement, which comprises a number of conductor components, that forms an electromagnetic field, and also a measuring arrangement, with which the system forms a measuring signal according to the field, and also transmitter associated with the object, and the aforementioned transmitter is arranged to connect by means of an electromagnetic field to the conductor arrangement and also to influence the measuring signal formed by the system according to the field.

The conductor arrangement of the invention can comprise e.g. printed conductor patterns.

The system can further comprise means for forming a measurement signal by means of impedance. The impedance of a conductor pattern can be measured in relation to the impedance of the whole conductor arrangement. The object can be located e.g. by identifying the measuring signal and at least one conductor pattern that participated in forming the signal.

The system can further comprise means for locating the position of an object in the area of the aforementioned conductor arrangement and position location system.

The position location system according to some embodiments of the invention can comprise means for measuring the impedance of at least one aforementioned conductor component and of the whole aforementioned conductor arrangement.

The transmitter according to some embodiments of the invention can comprise means for ASK modulation of the aforementioned measuring signal.

The transmitter can be connected to the object such that it connects by means of an electromagnetic field to the conductor component (conductor pattern) to be measured, and also via impedance to the object to be located.

In the case of an electrical field the conductor surface can function as the connection element of the electromagnetic field from the conductor component to the transmitter and/or to the object from the transmitter. In the case of a magnetic field a loop can function as the connection element.

The transmitter can influence the electromagnetic connection between the conductor component to be measured and the object with the control means of the transmitter, which can be e.g. a transistor, a switch, a resonator or a filter.

The transmitter according to the invention can comprise means for activation of the transmitter in the aforementioned electromagnetic field.

A position location system, which can comprise e.g. an apparatus for analyzing the measuring signal, can be connected to the system. The position location system can identify a located object or receive information closely connected to the object on the basis of the modulated measuring signal e.g. by demodulating the modulated measuring signal that it receives.

An exemplary position location system applicable to the use of the invention is described in the reference (Sepponen, Raimo. *Method and Arrangement for Observation*. International Patent Application No. WO2004F100489 20040820, 2005. U.S. Patent Application No. 2007008145, 2007)

The invention also relates to a method for identifying an object and/or locating the position of the object with the means of the system according to the invention.

DETAILED DESCRIPTION OF THE INVENTION

Figure 2:
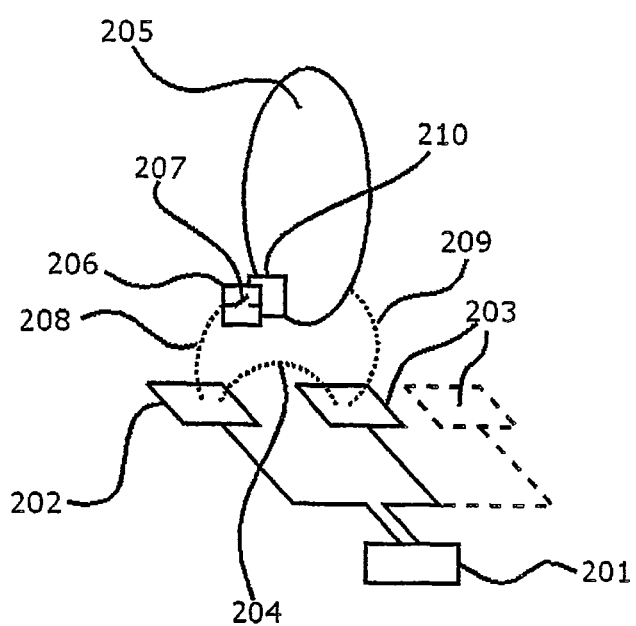
Figure 3:
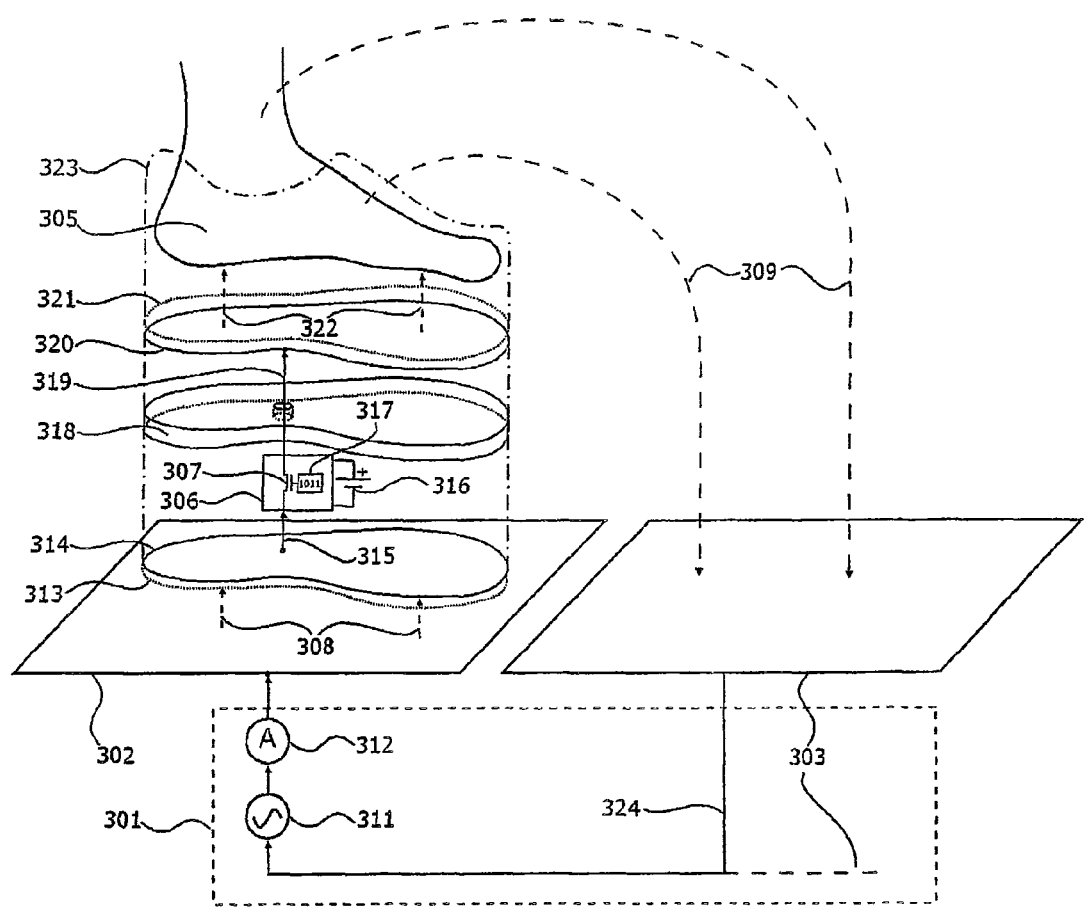

In the following the invention will be described in more detail with reference to some preferred embodiments presented as examples and to the attached drawings, wherein FIG. 1 presents one embodiment of the arrangement used in the invention, FIG. 2 presents one embodiment of the transmitter according to the invention and FIG. 3 presents one exemplary application of the invention.

FIG. 1 presents a position location system and identification system, which is based on near-field measurement, according to one embodiment of the invention. The position location system (101) measures the electromagnetic connection of the conductor pattern (102), which is installed under the floor surface, to the conductor pattern group (103). In other words, the system (101) measures the impedance (104) of one conductor pattern (102) in relation to the whole conductor pattern group (103) with a spot frequency or with a variable frequency. The conductor patterns form a conductor matrix, the impedance (104) of each element of which in relation to the whole matrix is measured alternately. When an object (105) possessing sufficient conductivity is in the proximity of the conductor pattern, the impedance to be measured decreases, which is registered as the presence of the object (105). The plurality of objects to be observed with the method includes, among others, people, animals, robots, metal furniture, and also different machines and vehicles. When a transmitter (106) according to some embodiments of the invention is connected to the object, the object can be identified from the measured signal.

A transmitter according to one embodiment of the invention is presented in FIG. 2. The transmitter (206) is connected to the object such that is connects electromagnetically to the conductor pattern (202) to be measured, and also to the object (205) to be located via impedance (208). The transmitter regulates the electromagnetic connection between the conductor pattern (202) to be measured and the object (205) with control means (207), which can be e.g. a transistor, a switch, a resonator or a filter. The object, for its part, connects to all the rest of the conductor matrix (203) via impedance (209). By means of the regulation the total impedance of the object visible in the measurement is converted or modulated such that the information is transferred from the transmitter (206) via the electromagnetic field for the position location system (201) to read. The information to be transferred can be e.g. the identifier or some other information of the transmitter (206). An interface means (210), e.g. a switch or a movement detector, can be connected to the transmitter, by means of which interface the transmitter can e.g. be activated to modulate the measuring signal received by the position location system (201).

The transmitter can be associated with an object e.g. by installing a transmitter in the footwear, clothing accessories, frame of the object, the casing of the object or the body of the object. The transmitter can be connected to the object e.g. by installing it into footwear in the manner illustrated in FIG. 3. The position location system (301) based on near-field measurement measures the impedance of the conductor plate (302) in relation to the whole conductor plate group (303) by supplying alternating current (311) to one conductor plate, and by measuring the strength (312) of the current. A conductor area is installed in the footwear (323) in the sole (314), which is insulated from the floor with a wearing surface (313). The electrical field is connected (308) to the conductor area (314), which for its part is connected with a conductor (315) to the transmitter (306), such as to e.g. a microcontroller. The microcontroller, which operates e.g. by means of a battery (316), modulates the measuring signal e.g. by interrupting the current passing through it with a transistor switch (307). The data to be modulated is retrieved from the memory (317) of the micro-controller. The microcontroller is connected, e.g. through the sole material (318) of the footwear, with a conductor (319) to the conductor area (320), which is fixed to a conducting or insulating insole (321). From here the current is connected (322) to the sole of the person using the footwear, from where there is a galvanic path to the whole object, e.g. to the body (305) of the person using the footwear. The body of the person, for its part, is connected (309) to the conductor plates (303) that function as a return path of the current, in which case the loop (324) to the voltage source closes. Now the transistor switch (307) of the transmitter, which is a part of the loop, converts or modulates the signal visible with a current meter and transfers the identifier or some other information of the transmitter to the position location system. The impedance is converted e.g. by using ASK modulation (amplitude-shift keying), which is well known to those skilled in the art. Now the person wearing the footwear can be identified and also, if desired, located. If a transmitter is not associated with an object, however, the object can always be located although not identified.

By means of the different embodiments of the invention presented, the problems of active position location systems can be resolved by adding an identification function to a passive position location system. The invention can thus enable transfer of the identification and other information of the object of position locating between the object and the position location system using a passive position location system based on near-field measurement. The information to be transferred is included in the measuring signal to be used in the position location by modulating it.

Likewise it is also obvious to the person skilled in the art that the exemplary embodiments presented above are for the sake of clarity comparatively simple in their structure and function. Following the model presented in this patent application it is possible to construct different and also very complex solutions that utilize the inventive concept presented in this patent application.

The invention claimed is:

1. A system for transferring information related to an object in an electromagnetic field, comprising:
   a conductor arrangement which includes multiple conductor components which form an electromagnetic field, and
   a transmitter associated with the object, the transmitter comprising a microcontroller with impedance altering means for altering an impedance between the object and at least a specific one of the conductor components closest to a position of the object,
   wherein the impedance altering means is adapted to modulate the electromagnetic field between the specific one of the conductor components closest to the position of the object, and also between the object and other conductor components which are further away from the position of the object, wherein the system is adapted to locate the position of the object in an area of the conductor arrangement by measuring the impedance between the specific one of the conductor components and the other conductor components of the conductor arrangement.

2. The system according to claim 1, wherein the conductor arrangement comprises conductor patterns.

3. The system according to claim 1, further comprising:
means for forming a measuring signal based on the impedance between the specific one of the conductor components and the other conductor components of the conductor arrangement.

4. The system according to claim 1, wherein the microcontroller comprises means for ASK modulation of a measuring signal.

5. The system according to claim 1, wherein transmitter comprises means for activating the transmitter in the electromagnetic field.

6. A method for identifying the object and locating the position of the object with the system according to claim 1.

7. The system according to claim 1, wherein the transmitter is connected to the object.

8. The system according to claim 1, wherein the transmitter is a single transmitter.

9. The system according to claim 1,
the microcontroller of the transmitter regulates the electromagnetic field between conductor patterns of the conductor arrangement to be measured and the object.

10. The system according to claim 1, wherein the microcontroller of the transmitter modulates the impedance and transfers information of the object via the electromagnetic field.

11. The system according to claim 1, wherein the system is adapted to locate the position of the object in the area of the conductor arrangement by measuring the impedance between the specific one of the conductor components closest to the position of the object and the other conductor components of the conductor arrangement, which are further away from the position of the object, with a variable frequency.

12. The system according to claim 1, wherein the object is a body of a person, and the transmitter is incorporated into an article worn on the body of the person.

13. The system according to claim 12, wherein the article worn on the body of the person is footwear,
wherein the system is adapted to measure the impedance of the specific conductor plate in relation to the whole conductor plate group by supplying an alternating current to the specific conductor plate, and by measuring a strength of the electromagnetic field,
the system further comprising:
a conductor area is installed in a sole of the footwear, which is insulated from the whole conductor plate group by a wearing surface of the footwear, the electromagnetic field being connected to the conductor area, which is connected to the microcontroller,
wherein the microcontroller is adapted to modulate the measuring signal received from the specific conductor plate, and to communicate the electromagnetic field to an insole of the footwear, from where the electromagnetic field is transmitted into the body of the person wearing the footwear, and a portion of the electromagnetic field in the body of the person extends outside of the body to others of the conductor plates,
wherein the portion of the electromagnetic field extending outside of the body to the others of the conductor plates functions as a return path of the electromagnetic field, thereby closing a loop of the electromagnetic field.

14. The system according to claim 13, wherein the microcontroller includes a transistor switch,
wherein the microcontroller is adapted to modulate the electromagnetic field by interrupting the measuring signal received by the microcontroller, and to transfer to the system an identifier or other information about the person wearing the footwear into which the transmitter is incorporated.

* * * * *